(12) United States Patent
Marton et al.

(10) Patent No.: US 7,884,655 B2
(45) Date of Patent: Feb. 8, 2011

(54) CONTROL CIRCUITRY

(75) Inventors: Walter Marton, Frankfurt (DE); Bernrd Germann, Brombachtal (DE)

(73) Assignee: Fujitsu Semiconductor Limited, Yokohama (JP)

( * ) Notice: Subject to any disclaimer, the term of this patent is extended or adjusted under 35 U.S.C. 154(b) by 109 days.

(21) Appl. No.: 12/346,297

(22) Filed: Dec. 30, 2008

(65) Prior Publication Data

US 2010/0123490 A1    May 20, 2010

(30) Foreign Application Priority Data

Nov. 14, 2008   (EP) ................................ 08169205

(51) Int. Cl.
*H03L 7/06* (2006.01)
(52) U.S. Cl. ........................ 327/156; 327/147
(58) Field of Classification Search ................. 327/147, 327/149, 156, 158
See application file for complete search history.

(56) References Cited

U.S. PATENT DOCUMENTS

| | | | |
|---|---|---|---|
| 6,023,198 A | 2/2000 | McKinney et al. | |
| 6,680,632 B1 | 1/2004 | Meyers et al. | |
| 6,680,654 B2* | 1/2004 | Fischer et al. | 331/17 |
| 6,727,736 B1* | 4/2004 | Tsang et al. | 327/157 |
| 6,826,246 B1 | 11/2004 | Brown et al. | |
| 7,023,249 B1* | 4/2006 | Mulbrook | 327/156 |
| 7,078,948 B2* | 7/2006 | Dosho | 327/157 |
| 7,417,477 B2* | 8/2008 | Koyama et al. | 327/156 |
| 7,622,967 B2* | 11/2009 | Kimura | 327/156 |
| 7,719,335 B2* | 5/2010 | Fu | 327/158 |
| 7,724,051 B2* | 5/2010 | Tomar et al. | 327/158 |
| 2006/0158264 A1* | 7/2006 | Kousai et al. | 331/16 |
| 2007/0040594 A1* | 2/2007 | Jung | 327/156 |
| 2008/0036513 A1* | 2/2008 | Koyama et al. | 327/156 |
| 2008/0265959 A1* | 10/2008 | Kimura | 327/156 |
| 2009/0066446 A1* | 3/2009 | Sahu et al. | 333/172 |

(Continued)

OTHER PUBLICATIONS

IEEE Standard for Local and metropolitan area network; Part 16: Air interface for fixed and Mobile Broadband Wireless Access Systems; Amendment 2: Physical and Medium Access Control Layers for Combined Fixed and Mobile Operation in Licensed Bands and Corrigendum 1, IEEE Computer Society and the IEEE Microwave Theory and Techniques Society, LAN/MAN Standards Committee, IEEE Std 802.16e TM-2005 and IEEE Std 802.16TM-2004/Cor1-2005 (Amendment and Corrigendum to IEEE Std 802.16-2004), Feb. 28, 2006 New York, New York.

(Continued)

*Primary Examiner*—Lincoln Donovan
*Assistant Examiner*—Adam D Houston
(74) *Attorney, Agent, or Firm*—Arent Fox, LLP

(57) ABSTRACT

Control circuitry, comprising: first control means operable to generate a first control signal, the first control signal being indicative of a relationship between an output signal and a first reference signal, and to generate said output signal in dependence upon said first control signal, the first control means being configured to tend to maintain a first desired relationship between the output signal and the first reference signal in response to said first control signal; and second control means configured to influence operation of said first control means in response to said first control signal by way of a second control signal so as to tend to maintain a second desired relationship between said first control signal and a second reference signal.

14 Claims, 12 Drawing Sheets

U.S. PATENT DOCUMENTS

2009/0146705 A1* 6/2009 Huang .................. 327/158

OTHER PUBLICATIONS

O. Werther et al., "A Fully Integrated 14-Band 3.1-to-10.6GHz 0.13μm SiGe BiCMOS UWB RF Transceiver," Solid—State Circuits Conference, 2008, ISSCC 2008, Digest of Technical Papers, IEEE International, Feb. 3-7, 2008, pp. 122,123, and 601.

Walter Marton et al., "Wide-Range Low-Noise Fast-Hopping Fractional-ΣΔ Synthesizer in 1.2-V 90-nm CMOS," Fujitsu Sci. Tech. J. 44, Jul. 3, 2008, pp. 274-284.

David A. Johns et al., "Analog Integrated Circuit Design,", ISBN 0-471-14448-7, Chapter 16 John Wiley & Sons, Inc.

"Phase-locked Loop," http://en.wikipedia.org/wiki/Phase_locked_loop, Oct. 14, 2008 (12 pages).

"Operational Transconductance Amplifier," http://en.wikipedia.org/wiki/Operational_transconductance_amplifier, Oct. 14, 2008 (3 pages).

"Frequency Synthesizer," http://en.wikipedia.org/wiki/Frequency_synthesiser, Oct. 14, 2008 (5 pages).

"Voltage-Controlled Oscillator," http://en.wikipedia.org/wiki/Voltage_controlled_oscillator, Oct. 14, 2008 (3 pages).

"Phase detector," http://en.wikipedia.org/wiki/Phase_detector, Oct. 14, 2008 (4 pages).

"Dual-modulus Prescaler" http://en.wikipedia.org/wiki/Dual-modulus_prescaler, Oct. 14, 2008 (3 pages).

"Frequency Divider," http://en.wikipedia.org/wiki/Frequency_divider, Oct. 14, 2008 (3 pages).

"Prescaler," http://en.wikipedia.org/wiki/Prescaler, Oct. 14, 2008 (1 page).

"Charge Pump," http://en.wikipedia.org/wiki/Charge_pump, Oct. 14, 2008 (2 pages).

"Low-Pass Filter," http://en.wikipedia.org/wiki/Low-pass_filter, Oct. 28, 2008 (6 pages).

* cited by examiner (a)

(b)

Legend
CP: Charge pump
IDiv: Integer divider
LF: Loop filter
MDiv: Main divider
PD: Phase detector
RDiv: Reference divider
SPI: Serial peripheral interface
VCO: Voltage controlled oscillator
XTAL: Crystal oscillator

CONTROL CIRCUITRY

The present invention relates to control circuitry. In particular, but not exclusively, the present invention relates to such control circuitry for use in communication systems, for example in wireless communication systems.

Typically, modern communication systems require the generation of a stable carrier signal, for example having a desired and stable carrier frequency. Such communication systems typically employ synthesisers and the like to generate such carrier signals. Control circuitry embodying the present invention may, for example, be used to generate such carrier signals and may form part or all of such synthesisers.

The performance of today's front-end architectures for wireless communication depends to an increasing degree on the performance of the employed synthesisers. This is because new wireless communication standards that aim for high data efficiency, like IEEE 802.16e (Mobile WiMAX), set tight requirements on the clarity and agility of the carrier generation. At the same time, the increased market pressure for highly integrated solutions with growing digital complexity is moving the target technologies for such front-ends below 100 nm, which adds additional limitations to the analogue design approach for synthesiser integration. As a result, it is a challenging task to implement competitive high-performance analogue blocks in a technology optimized for high-density digital design.

Typical demands in current synthesiser design are as follows. Firstly, a large voltage controlled oscillator (VCO) range (e.g. ~500 MHz) is typically desired at a frequency (e.g. 3 GHz) where parasitic effects significantly reduce the usable control range. Secondly, a low (e.g. 1.2-V) power supply voltage is often desired, which significantly limits the usable VCO control range to some 100s of mV's (when considering saturation margins), which is in conflict with the requirement for low VCO gain and extended frequency control range. Thirdly, there is the desire for low power consumption, which leads to higher power-related impedances (such as VCO tank impedance and loop filter impedance), but which conflicts with the requirement for lower impedance to yield low noise (e.g. −95 dBc @ 100-kHz offset).

In addition to this, significant frequency drift may be suffered over a specified temperature range (e.g. a range from −40° C. to +80° C. or +125° C.). Since a practical synthesiser preferably allows continuous operation for hours without any frequency hopping, this implies a desire for temperature compensation capability during continuous operation.

In a paper entitled "A Fully Integrated 14-Band 3.1- to −10.6 GHz 0.13 μm SiGe BiCMOS UWB RF Transceiver", by O. Werther et al, ISSCC Conference, Session 6, UWB Potpourri, 6.4, pages 122 and 123, there is disclosed a synthesiser having a dual-control-input VCO. This VCO is used in a way, which increases frequency range, that employs two control paths, one of them with low bandwidth able to compensate for slow changes only (e.g. temperature) but contributing less noise in exchange, and the other used in the usual way. This system requires varying control voltage (the DC-level is the same for both inputs) and is therefore limited by the low supply-voltage requirement.

It is desirable to solve some or all of the above problems. In particular, it is desirable to provide control circuitry in which the effect of possible temperature drift can be compensated for, preferably during continuous operation.

According to a first aspect of the present invention, there is provided control circuitry, comprising: first control means operable to generate a first control signal, the first control signal being indicative of a relationship between an output signal and a first reference signal, and to generate said output signal in dependence upon said first control signal, the first control means being configured to tend to maintain a first desired relationship between the output signal and the first reference signal in response to said first control signal; and second control means configured to influence operation of said first control means in response to said first control signal by way of a second control signal so as to tend to maintain a second desired relationship between said first control signal and a second reference signal.

By acting to maintain a desired relationship between the first control signal and the second reference signal, it is possible to keep operation of components in the first control means within certain bounds. This is advantageous, as by reducing the range over which components must operate it is possible to increase efficiency, save cost, reduce power consumption, improve noise performance, improve speed of operation, and the like.

The second control means may be operable to generate said second control signal, the second control signal being indicative of a relationship between the first control signal and the second reference signal.

The circuitry may be susceptible to high-frequency disturbances and to low-frequency disturbances. The high-frequency disturbances may be low-energy disturbances only capable, in the absence of said low-frequency disturbances, of causing a magnitude of said first control signal to fluctuate by a particular amount, and the low-frequency disturbances may be high-energy, disturbances capable, in the absence of said second control means, of causing the magnitude of the first control signal to fluctuate by an amount substantially larger than said particular amount.

Preferably, the second control means is operable to control said first control means with said second control signal such that the magnitude of said first control signal in the presence of such high-frequency and low-frequency disturbances fluctuates (only) within a band of magnitude values defined by said particular amount. Such a band of magnitudes may be referred to as a "sweet spot". The second control means may comprise band-positioning means operable to controllably position said band of magnitudes relative to a datum magnitude. In that way, the "sweet spot" may be controllable.

In one embodiment, the control circuitry comprises means operable to control operation of said first control means such that, when said first desired relationship is changed, a position of said band of magnitudes relative to the datum magnitude remains the same. The first desired relationship may be changed, for example, if a change in output signal is required without changing the first reference signal. In the case of a synthesiser, it may be that a change in output frequency is desired. It is advantageous to keep the same "sweet spot" despite these changes.

In one embodiment, the first control means forms a first control loop configured to compensate for the effect of said high-frequency disturbances in said first desired relationship, and the second control means forms part of a second control loop configured to compensate for the effect of said low-frequency disturbances in said first desired relationship by way of compensating for corresponding low-frequency disturbances in said second desired relationship.

The low-frequency disturbances may be caused by any number of possible factors. For example, the low-frequency disturbances may result from changes in ambient temperature, or pressure, or may even result from ageing effects on the circuitry.

The second control means may be responsive to substantially lower-frequency changes in said control signal than that of said first control means. It is advantageous for the frequency responses to be separated apart in this way, to reduce interaction between the two control responses, i.e. interaction between the compensation function provided by the first control means, and that provided by the presence of the second control means.

In one embodiment, the first control means has a first low-pass filter operative upon said first control signal, the second control means has a second low-pass filter operative upon said second control signal, and the cut-off frequency of said second low-pass filter is substantially lower than that of said first low-pass filter. In this way, the interaction discussed above may be reduced.

The control circuitry may be configured to perform the function of a phase-lock loop, wherein: the first control means comprises a dual-input voltage-controlled oscillator; and one of those inputs is connected to receive said first control signal and the other one of those inputs is connected to receive said second control signal. Both inputs may be employed to generate the output signal of the voltage-controlled oscillator. In this way, the burden on the input receiving the first control signal is reduced because some control functionality is performed by way of the input receiving the second control signal.

The second control means may be operable to generate the second control signal in dependence upon a comparison between the first control signal and the second reference signal. For example, the second control means may comprise a comparator configured to carry out said comparison. The second control means may comprise an amplifier operable in dependence upon the comparison to generate the second control signal such that said second control signal may fluctuate over a substantially large range relative to fluctuations of said first control signal. An operational transconductance amplifier may be configured to carry out the comparison. The means employed to carry out the comparison may serve to DC-separate said second control signal from said first control signal.

By DC-separating the second control signal from the first control signal, and by performing amplification in conjunction with the comparison, the second control signal may fluctuate over a particularly large range. This is advantageous, as better (more accurate) control can be performed with a control signal defined over a large range than for one defined over a small range. Changes in magnitude are more easily detectable when those changes are larger.

The first reference signal may have a reference frequency, the output signal may have an output frequency, and the first desired relationship may be a frequency-based relationship between said reference frequency and said output frequency. Such an arrangement may, for example, render the functionality of the circuitry similar to that of a phase-lock loop.

The second reference signal may have a reference magnitude, the first control signal may have a control magnitude, and the second desired relationship may be a magnitude-based relationship between the reference magnitude and the control magnitude. The second reference signal and first control signal may be voltage signals, characterised by their magnitudes.

At least one of said first and second desired relationships is controllable. For example, by controlling said first desired relationship, it may be possible to controllably vary the output signal whilst keeping the first reference signal constant. By controlling the second desired relationship, it may be possible to controllably vary the "sweet spot".

The second control means may comprise preset means operable, during a setup phase, to preset said second control signal to a preset value. The second control means may be operable, during an operational phase, to base generation of the second control signal on said preset value. The preset value employed in one operational phase may be based on the preset value from a preceding setup phase.

The preset value may be configurable in dependence upon an external factor. The external factor may be current ambient temperature, and the preset means may comprise a sensor operable to measure the current ambient temperature. Other external factors may be taken into account, and other sensors may be employed to monitor those other factors.

The preset value is preferably a value in a range of magnitude values open to the second control signal corresponding to the position of the current ambient temperature (a measurement of the external factor concerned) within a range of ambient temperatures (a range of measurements of the external factor concerned) over which the circuitry is adapted to operate. In that way, use of the preset means may enable the second control signal to provide linear control over the desired range.

The second reference signal may be different from the first reference signal. The second reference signal may be based upon, or generated from, the first reference signal, or vice versa.

According to a second aspect of the present invention, there is provided phase-lock loop circuitry, comprising control circuitry according to the aforementioned first aspect of the present invention.

According to a third aspect of the present invention, there is provided a synthesiser, comprising control circuitry according to the aforementioned first aspect of the present invention.

According to a fourth aspect of the present invention, there is provided a transmitter, a receiver or a transceiver for use in a wireless communication system, comprising control circuitry according to the aforementioned first aspect of the present invention.

According to a fifth aspect of the present invention, there is provided a wireless communication system, comprising at least one transmitter and at least one receiver according to the aforementioned fourth aspect of the present invention.

According to a sixth aspect of the present invention, there is provided a control method, comprising: generating a first control signal, the first control signal being indicative of a relationship between an output signal and a first reference signal; generating said output signal in dependence upon said first control signal; acting to maintain a first desired relationship between the output signal and the first reference signal in response to the first control signal; and influencing generation of said first control signal in response to said first control signal by way of a second control signal so as to tend maintain a second desired relationship between said first control signal and a second reference signal.

Reference will now be made, by way of example only, to the accompanying drawings, of which;

Figure 6:
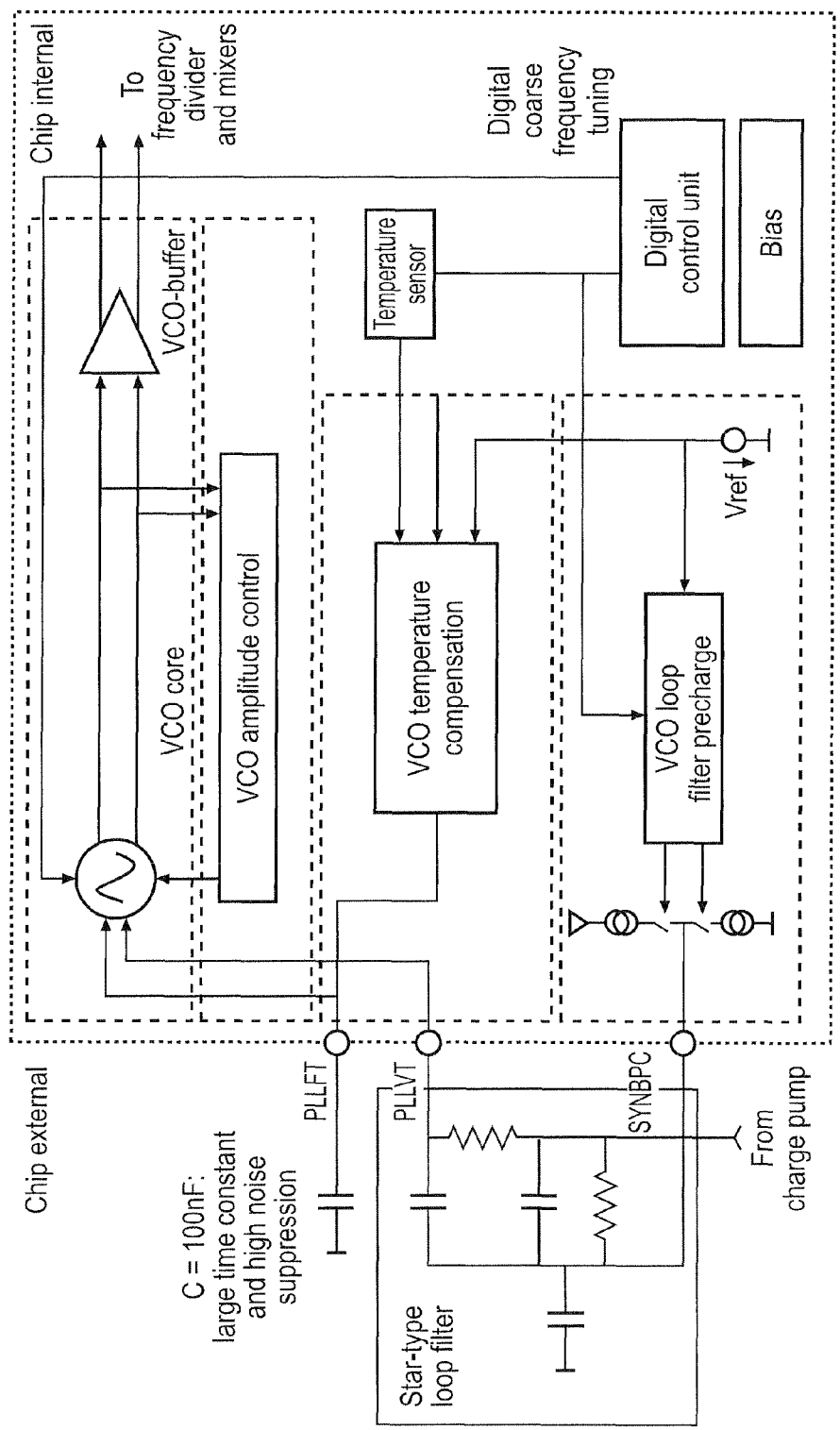
FIG. 6 is a schematic diagram of a synthesiser as an example implementation of an embodiment of the present invention.
Figure 9:
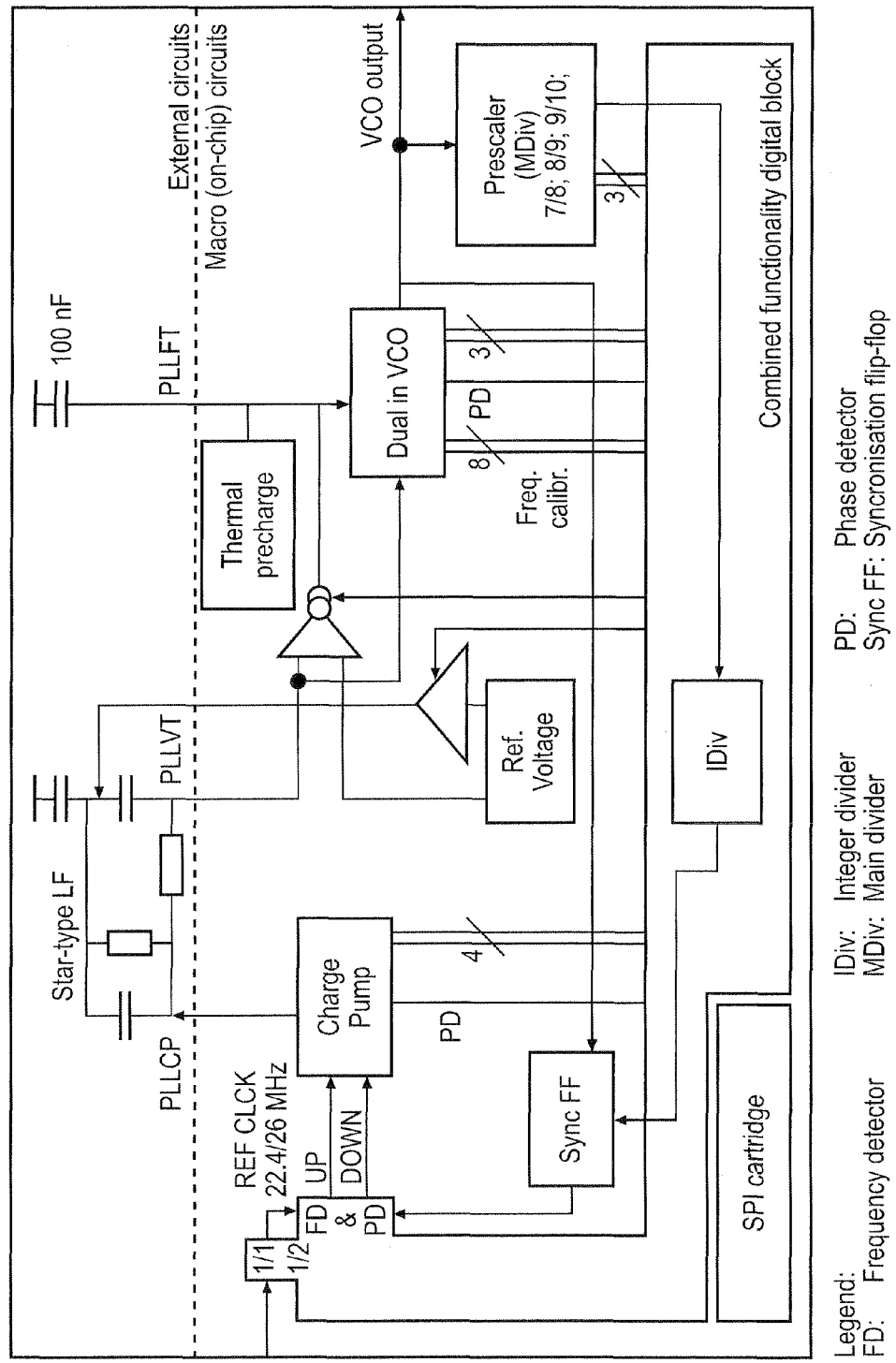
Figure 10:
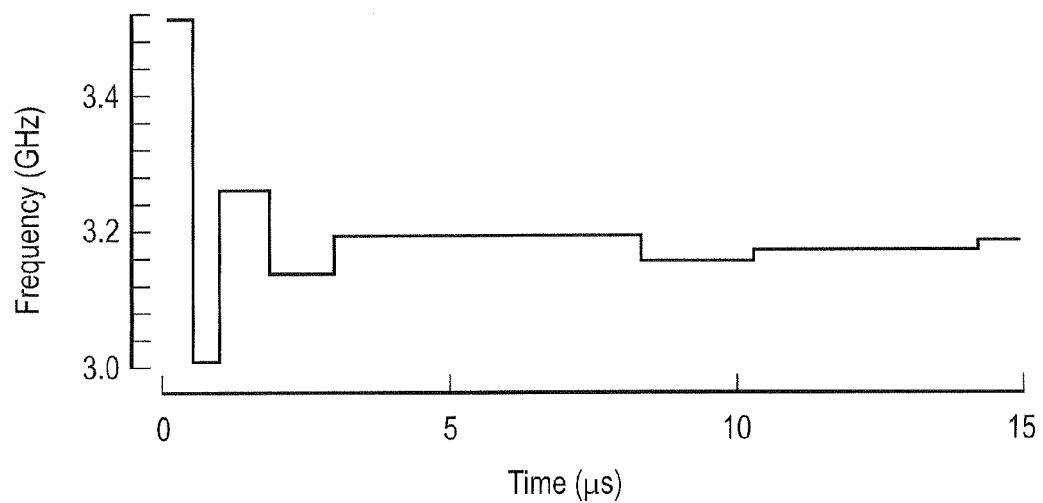
Figure 11:
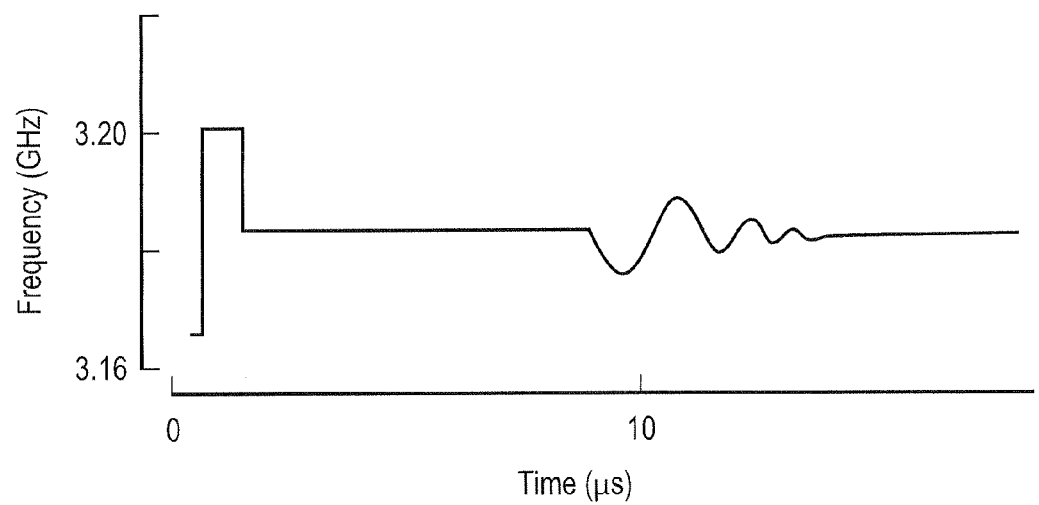
Figure 12:
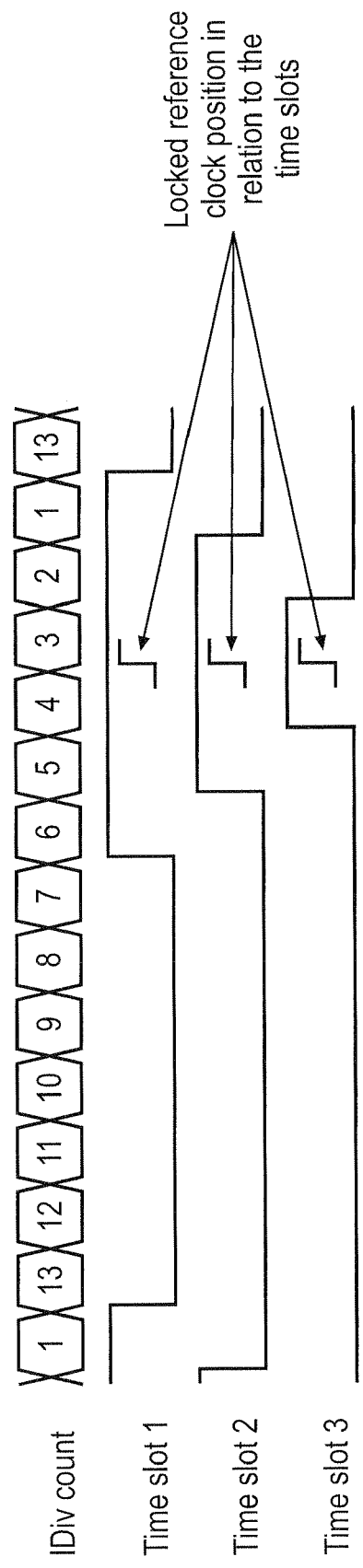
Figure 13:
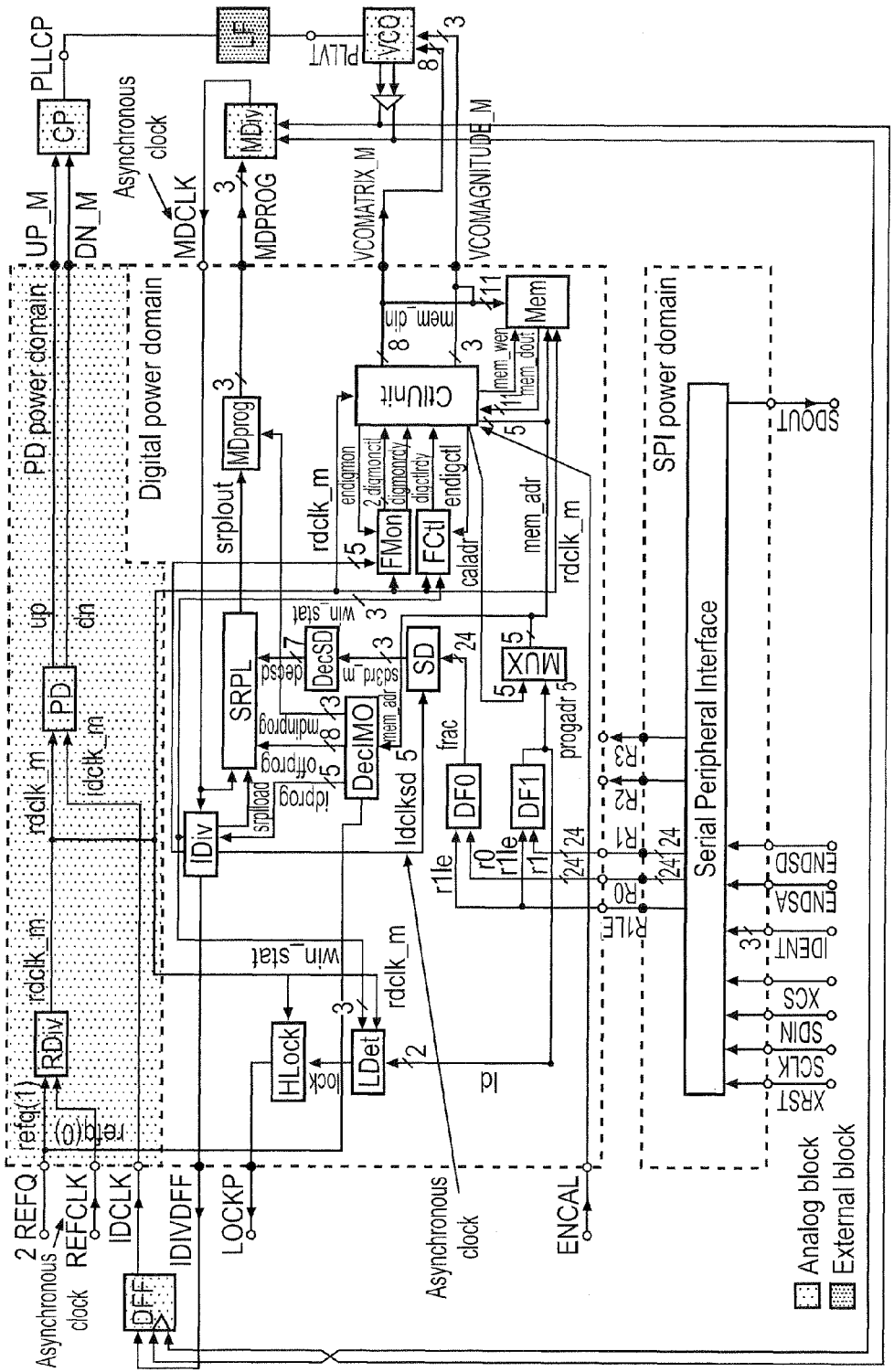

FIG. 9 presents a detailed schematic view of the FIG. 6 synthesiser architecture, with emphasis on the analogue units;

FIG. 10 shows an example frequency calibration sequence (VCO output frequency over time) relating to the example implementation;

FIG. 11 shows an example of output frequency during recalibration (shortened sequence) and final analogue locking, relating to the example implementation;

FIG. 12 shows three possible phase-detector time slots derived from IDiv setting 13; and FIG. 13 is a block-level schematic diagram of the digital control unit and connectivity to other blocks in the example implementation.

Figure 1:
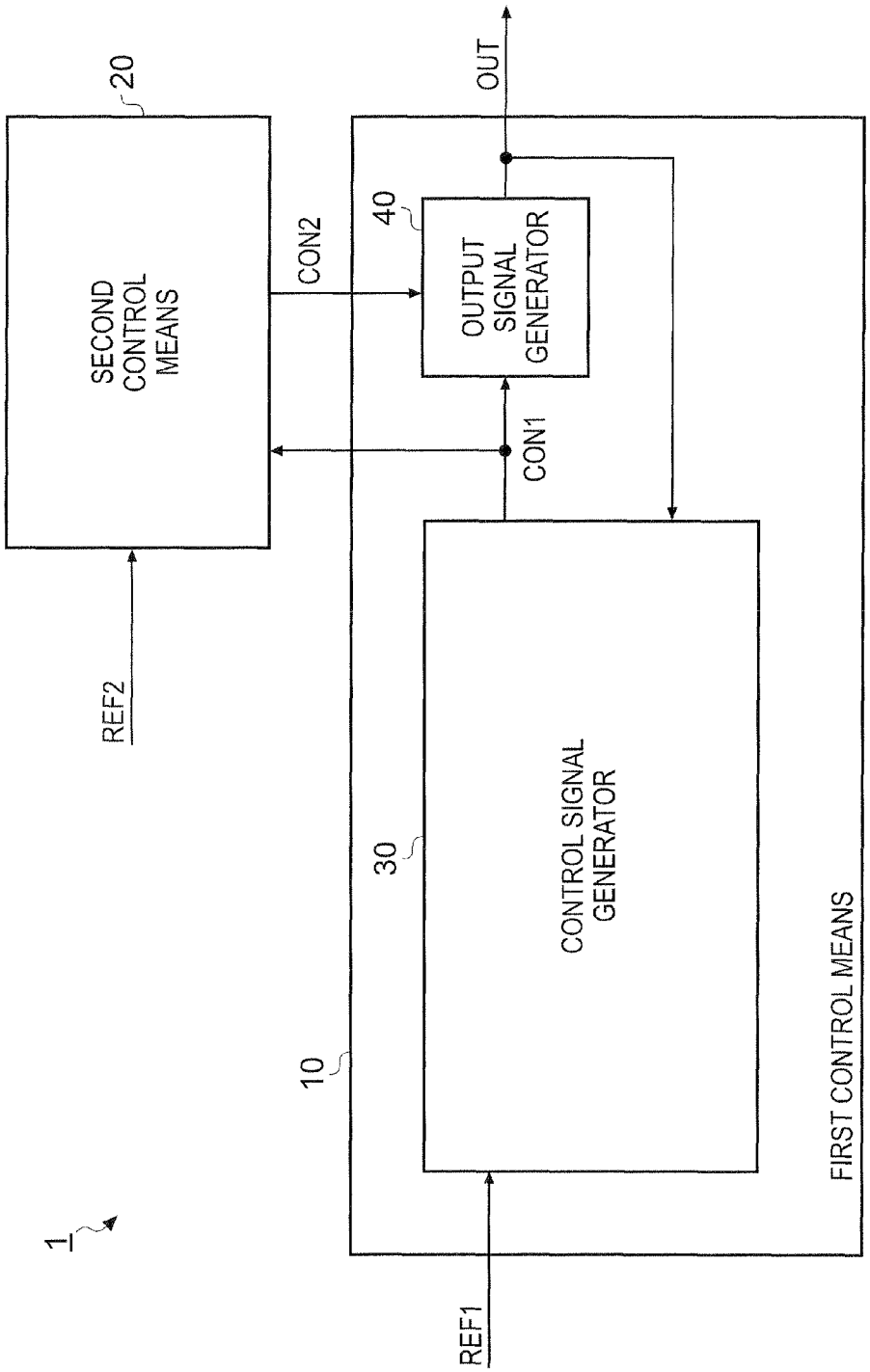
FIG. 1 is a schematic diagram of control circuitry 1 embodying the present invention.

FIG. 1 is a schematic diagram of control circuitry 1 embodying the present invention. Control circuitry 1 comprises first control means 10 and second control means 20. First control means 10 comprises a control-signal generator 30 and an output-signal generator 40.

In general terms, the first control means is operable to generate a control signal CON1 which is indicative of a relationship between an output signal OUT and a reference signal, and to generate the output signal OUT in dependence upon the control signal CON1. The first control means is configured to tend to maintain a first desired relationship between the output signal OUT and the reference signal in response to the control signal CON1. Further, in general terms, the second control means is configured to influence operation of the first control means in response to the control signal CON1 so as to tend to maintain a second desired relationship between the control signal CON1 and the or another reference signal. Furthermore, the second control means is configured to be responsive to a substantially lower frequency changes in the control signal CON1 than that of the first control means.

Returning to FIG. 1 itself, the control signal CON1 generator 30 is connected to receive a reference signal REF1 and the output signal OUT, and to generate the control signal CON1 in dependence upon those two received signals. The output-signal generator 40 is connected to receive the control signal CON1 from the control-signal generator 30 and to generate the output signal OUT in dependence thereon. It is noted that output-generator 40 is also connected to receive an additional signal from the second control means 20, however, for the benefit of an understanding of the first control means, this additional signal will be ignored at this stage.

In use, the control-signal generator 30 compares the output signal OUT with the reference signal REF1, and indicates in the control signal CON1 a relationship between the output signal OUT and the reference signal REF1. An example desired relationship between the output signal OUT and the reference signal REF1 may be that their magnitudes are the same, in which the case the value of the control signal CON1 may represent differences in magnitude between the output signal OUT and the reference signal REF1. The desired relationship may be that the magnitude of the output signal OUT is a factor higher or lower than that of the reference signal REF1, for example an integer factor higher or lower. Moreover, the desired relationship may be frequency-based rather than magnitude-based, in which case the control signal CON1 may indicate differences in, for example, phase.

The output-signal generator 40, in use, takes the control signal CON1 into account when generating the output signal OUT. The overall effect of the first control means 10 is therefore for any differences between the actual relationship, between the output signal OUT and the reference signal REF1, and the desired relationship to be compensated for, so as to bring the actual relationship towards the desired relationship. In the example case where the desired relationship is frequency-based, the first control means 10 may be considered to be equivalent to a phase-locked loop (PLL).

The second control means 20 is generally provided to try to keep the operation of the first control means 10 within certain bounds. The use of the second control means 20 will now be explained in more detail.

The second control means 20 is connected to receive the control signal CON1 and the reference signal REF2 and to output a further control signal CON2 to the output-generator 40. The reference signal REF2 may be based upon (or identical to) the reference signal REF1, or may be an independently-provided reference signal.

In use, the second control means 20 compares the control signal CON1 with the reference signal REF2, and generates the further control signal CON2 to indicate a relationship between the control signal CON1 and the reference signal REF2. As before, an example desired relationship may be that their magnitudes are the same, in which case the value of the further control signal CON2 may represent differences in magnitude between the control signal CON1 and the reference signal REF2.

The output signal OUT generator 40 is configured to receive the control signal CON1 and the further control signal CON2, and to generate the output signal OUT in response to both received control signals. In this way, the second control means 20 serves to keep the control signal CON1 in a desired relationship with respect to the reference signal REF2 (e.g. in a so-called "sweet spot"), and acts to compensate for any diversions from the desired relationship.

Accordingly, in summary, the first control means 10 serves to maintain a desired relationship between the output signal OUT and the reference signal REF1, and the second control means 20 (in conjunction with the first control means 10) serves to maintain a desired relationship between the control signal CON1 and the reference signal REF2.

The control loop (the main loop) formed by the first control means 10 (and not including the second control means 20) is preferably configured to be fast, i.e. responsive to higher frequency fluctuations/changes in the control signal CON1, so as to tend to keep the desired relationship between the output signal OUT and the reference signal REF1 in spite of high-frequency disturbances. In contrast, the control loop (the auxiliary loop) formed by the second control means 20 (in conjunction with the first control means 10) is preferably configured to be slow, i.e. responsive to low-frequency fluctuations/changes in the control signal CON1, so as to tend to keep the desired relationship between the control signal CON1 and the reference signal REF2 in spite of low-frequency disturbances. Such low-frequency disturbances may for example be due to temperature variation, or may be due to other external effects.

The difference in frequency response between the two loops reduces any interaction between them, so as to tend to prevent one loop from affecting the operation of the other, and reducing the chance of the auxiliary loop adding unwanted additional noise into the main loop. For example, if both loops had the same (or closely similar) frequency response, they may both try to compensate for disturbances at the same rate as one another, causing for example overshooting of the intended settling point and creating an unstable system. The overall effect may be comparable to a system with poor noise performance. Therefore, the frequency responses of the two loops are preferably carefully chosen to minimise any interactions.

Figure 2:
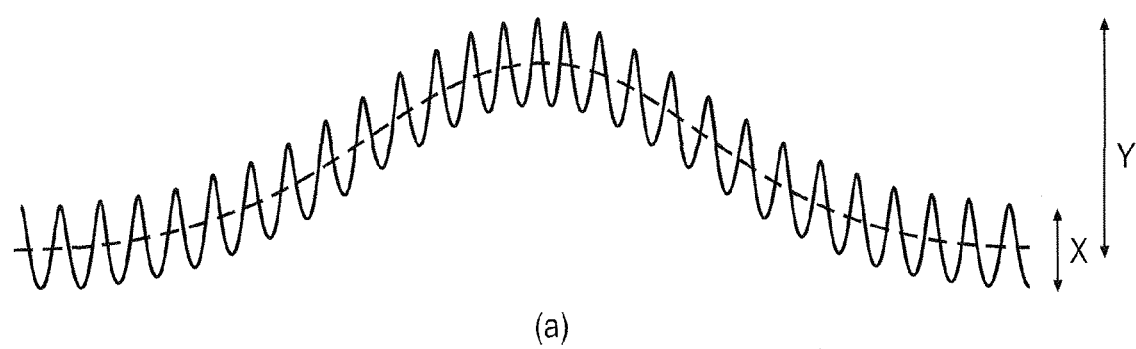
FIG. 2 is a schematic diagram representing control signal CON1 in two situations.
Figure 2:
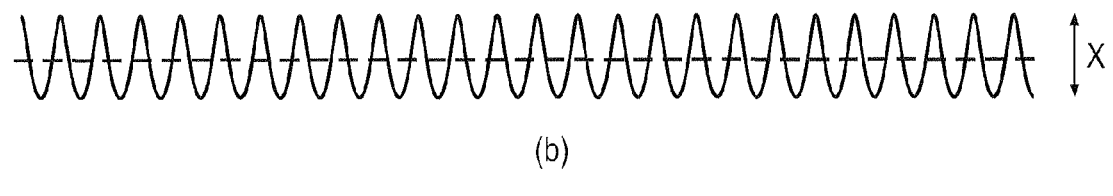

To better understand the potential benefit of providing the auxiliary loop in addition to the main loop, reference will now be made to FIG. 2. FIG. 2 is a schematic diagram representing control signal CON1 in two situations. In FIG. 2, high-frequency fluctuations are shown in control signal CON1 to assist in a better understanding of the present invention, however it will be appreciated that the first control means would act to reduce or even remove this high-frequency fluctuation.

In FIG. 2(a), it is assumed that second control means 20 is not present, or at least it is assumed that the input control signal CON2 to the output-signal generator 40 has been disconnected. Without the assistance of the auxiliary control loop, the control signal CON1 presented to the output signal generator has high-frequency and low-frequency components. This is represented in FIG. 2(a), with the high-frequency components readily apparent from the solid line, and the low-frequency components indicated by the dashed line. This control signal CON1 indicates that the main loop is experiencing both high and low-frequency disturbances from the desired relationship between the output signal OUT and the reference signal REF1. As also indicated in FIG. 2(a), the magnitude of the high-frequency fluctuations, X, is generally substantially smaller than the magnitude of the low-frequency fluctuations, Y. This is typical, for example, if the high-frequency fluctuations are caused by low-energy disturbances, for example due to noise in the main loop, and if the low-frequency fluctuations are caused by relatively high-energy disturbances, for example due to a change in ambient temperature (for example over a large range, such as from −40° C. to +125° C.).

With careful design, the main loop can be designed to respond to the example control signal CON1 in FIG. 2(a), however in that case the output-signal generator 40, and corresponding other elements in the control-signal generator 30, need to be able to deal with fluctuations in the relatively large range Y (in comparison to range X), and this may have significant cost, complexity and power-consumption-related disadvantages.

In FIG. 2(b), in contrast to FIG. 2(a), it is assumed that second control means 20 is present. As mentioned above, the auxiliary loop is configured to be responsive to low-frequency fluctuations in the control signal CON1, and to influence the output-signal generator 40, with control signal CON2, to compensate for those low-frequency fluctuations. Accordingly, with the assistance provided by the auxiliary loop (i.e. including the second control means 20), the control signal CON1 presented to the output-signal generator 40 effectively has had the low-frequency fluctuations (which were indicative of low-frequency disturbances) removed. This is apparent from FIG. 2(b), in which the dashed lined no longer fluctuates.

In the scenario in FIG. 2(b), which corresponds to embodiments of the present invention, considerable advantages are provided. In this scenario, the output-signal generator 40, and corresponding other elements in the control-signal generator 30, need only be able to deal with fluctuations in the relatively small range X (in comparison to range Y). Accordingly, considerable savings in cost, complexity and power-consumption are achieved.

Figure 3:
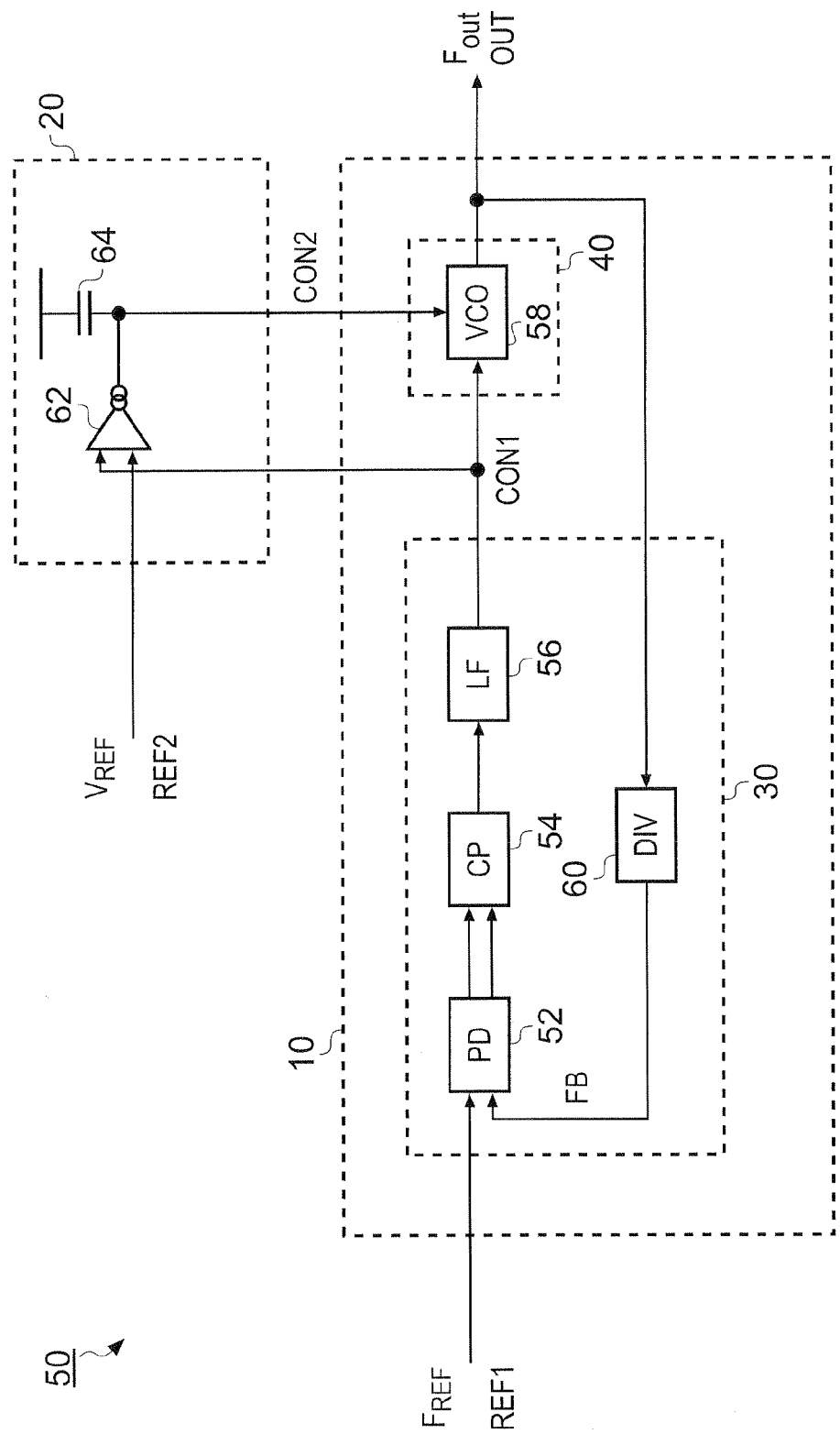
FIG. 3 is a schematic diagram of control circuitry 50 embodying the present invention.

FIG. 3 is a schematic diagram of control circuitry 50 embodying the present invention. Control circuitry 50 is an example implementation of control circuitry 1, and accordingly like elements are denoted by like reference numerals (as is true of other embodiments of the invention disclosed herein), and duplicate description is therefore omitted.

Control circuitry 50 is implemented to perform the general function of a phase-locked loop (PLL). In general terms, a PLL is a control system that generates a signal (c.f. output signal OUT) that has a fixed relation to the phase of a "reference" signal (c.f. reference signal REF1). A PLL circuit responds to both the frequency and the phase of the available signals, automatically raising or lowering the frequency of a controlled oscillator until it is matched to the reference (reference signal REF1) in both frequency and phase. A PLL is an example of a control system using negative feedback.

In simpler terms, a PLL compares the frequencies of two signals (in FIG. 1, the reference signal REF1 and the output signal OUT, or signals based thereon) and produces an error signal (control signal CON1) which is proportional to the difference between the input frequencies. The error signal is used to drive a voltage-controlled oscillator (VCO) which creates an output frequency. The output frequency is fed through an optional frequency divider back to the input of the system, producing a negative feedback loop. If the output frequency drifts, the error signal will increase, driving the frequency in the opposite direction so as to reduce the error. Thus, the output is locked to the frequency at the other input. This input is called the reference (reference signal REF1) and is typically derived from a crystal oscillator, which is very stable in frequency.

Phase-locked loops are widely used in radio, telecommunications, computers and other electronic applications. They may generate stable frequencies, recover a signal from a noisy communication channel, or distribute clock timing pulses in digital logic designs such as microprocessors. Since a single integrated circuit can provide a complete phase-locked-loop building block, the technique is widely used in modern electronic devices, with output frequencies ranging from a fraction of a cycle per second up to many GHz.

PLL circuits generally include three basic elements, namely a phase detector, a variable electronic oscillator, and a feedback path (which often includes a frequency divider). These basic elements will become apparent on further consideration of FIG. 3.

In control circuitry 50, first control means 10 comprises a phase detector (PD) 52, a charge pump (CP) 54, a low-pass filter (LF) 56, a voltage-controlled oscillator (VCO) 58, and a divider (DIV) 60. Second control means 20 comprises an operational transconductance amplifier (OTA) 62 and a capacitor 64. Phase detector 52, charge pump 54, low-pass filter 56 and frequency divider 60 are part of control-signal generator 30, and voltage-controlled oscillator 58 is part of output-signal generator 40.

Because the overall operation of control circuitry 50 is in the frequency domain (in a PLL, the comparison made is a phase-based comparison), reference signal REF1 is defined by a reference frequency $F_{REF}$, and output signal OUT has an output frequency $F_{OUT}$.

Phase detector 52 is connected to receive the reference signal REF1 and a feedback signal FB. Divider 60 is connected to receive the output signal OUT and to generate the feedback signal FB for input to the phase detector 52. Assuming that divider 60 divides the frequency $F_{OUT}$ of output signal OUT by a factor N, the feedback signal FB has frequency $F_{OUT}/N$. Phase detector 52 outputs two signals, an "up" signal and a "down" signal, to charge pump 54, which in turn has its output signal low-pass filtered by low-pass filter 56, thereby generating control signal CON1.

In general terms, based on the detection of the phase difference between the reference signal REF1 and the feedback signal FB, the phase detector 52 controls the "up" and "down" signals, thereby controlling the charge pump 54 such that charge pulses output from charge pump 54 are indicative of the detected phase difference. These pulses are then typically fed to a capacitor acting as an integrator (making up part of low-pass filter 56) such that control signal CON1 is a voltage signal whose magnitude is indicative of the detected phase difference. Some low-pass filtering is of course understood to have been carried out by the low-pass filter 56.

Voltage-controlled oscillator 58 receives control signal CON1, whose voltage level is used to control its output frequency $F_{OUT}$, and hence the output signal OUT.

As in most PLLs, control circuitry 50 includes a divider 60 in the feedback path to produce a frequency synthesiser. If the divider ratio N is said to be, for example, 2, then the phase detector 52 will compare the frequencies $F_{REF}$ and $F_{OUT}/2$ (i.e. $F_{OUT}/N$), and thus the frequency $F_{OUT}$ will tend towards $2*F_{REF}$ (i.e. $N*F_{REF}$). A programmable divider 60 (a divider whose divider ratio N is controllable) is particularly useful in radio applications and the like, since a large numbers of oscillator frequencies can be produced from a single stable, accurate, but expensive, quartz/crystal controlled reference oscillator (forming reference signal REF1).

Some PLLs include a reference divider (RDIV) between the reference clock (REF1) and the reference input to the phase detector 52. Although this RDIV is not shown in FIG. 3, it will of course be appreciated that the present invention extends to include such a divider. If the reference divider has a divider ratio M, it allows the output frequency $F_{OUT}$ to tend towards $(N/M)*(F_{REF})$. It might seem simpler to feed the PLL with a different $F_{REF}$, but in some cases the reference signal REF1 is constrained by other issues, and then the reference divider is useful. In consideration of the present control circuitry 50, it is understood that the reference signal REF1 has already been divided by a reference divider, or that no such reference divider is present.

Turning now to the second control means 20 in control circuitry 50, the OTA 62 is connected to receive the control signal CON1 and the reference signal REF2. As this part of control circuitry 50 operates in the time domain (the voltage magnitude of control signal CON1 is decisive), the reference signal REF2 is defined by a reference voltage $V_{REF}$.

The OTA 62 is an amplifier whose differential input voltage produces an output current. Thus, it is a voltage-controlled current source (VCCS). Accordingly, OTA 62 compares the voltage level of control signal CON1 with reference voltage $V_{REF}$, and outputs a current accordingly. This output signal charges (or discharges) capacitor 64, and the voltage (potential difference) stored over capacitor 64 forms the control signal CON2 which is fed back to the voltage-controlled oscillator 58.

The storing of a voltage over capacitor 64 forms a low-pass filter function, and the capacitance value of capacitor 64 is said to be high (e.g. 100 nF), such that its pass-band is very low, i.e. such that its cut-frequency is very low. With a 100 nF value, for example, the capacitor 64 functions as a blocking capacitor, resulting in very low bandwidth of the auxiliary loop, which helps to reduce interaction between the two loops (and to limit the noise contribution generated by the auxiliary loop).

The additional input to the VCO 58 employed to receive control signal CON2 carries the risk that it is a noise contributor to the main loop (as discussed above). The wider control range compared to the VCO input receiving control signal CON1 (the additional input is dealing with the range Y in FIG. 2 rather than the smaller range X) increases the risk of excessive noise generation. The high-value capacitor 64 (e.g. 100 nF), which forms a low impedance even at frequencies below 10 KHz, reduces noise voltage generation via the additional input.

Accordingly, in use, the control signal CON2 is generated based on a comparison between signal CON1 and the reference voltage $V_{REF}$, and the operation of the voltage-controlled oscillator 58 is influenced thereby to effectively keep the control signal CON1 in the vicinity of the reference voltage $V_{REF}$. The vicinity of the reference voltage $V_{REF}$ may be referred to as the "sweet spot" and the voltage-controlled oscillator 58 design (and that of circuitry in the control-signal generator 30) may be optimised to operate in that "sweet spot".

The comparison made in the second control means 20 between the control signal CON1 and the reference signal REF2 serves to DC-separate the control signal CON2 from the control signal CON1. By DC-splitting the two paths, it is possible to allow the main loop (see FIG. 3) to have its control signal CON1 always in the "sweet spot" (defined by reference signal REF2) thereby enabling constant superior dynamic performance of that main loop, while allowing the control signal CON2 to vary widely as necessary, potentially "rail-to-rail", without disturbing the noise performance of the overall control circuitry (e.g. synthesiser).

Figure 4:
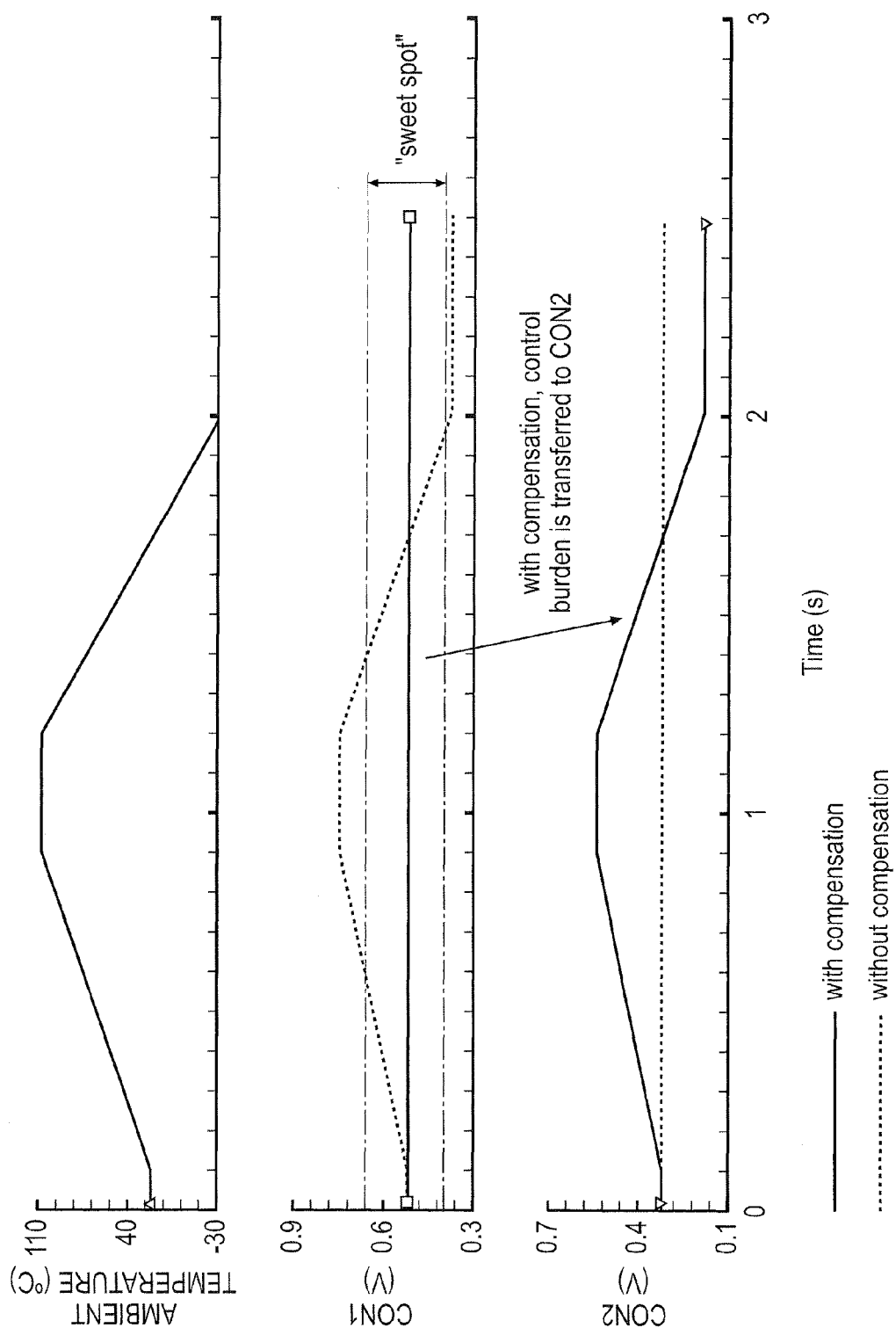
FIG. 4 shows three graphs useful for better understanding operation of the control circuitry 50.

FIG. 4 shows three graphs useful for better understanding operation of the control circuitry 50.

The upper graph shows a change in ambient temperature over time. The middle and lower graphs show the control signals CON1 and CON2, respectively, over the same time period. In the middle and lower graphs, the solid line represents the control signal concerned with temperature compensation (i.e. with the control signal CON1 input to the OTA 62) and the dashed line represents the control signal concerned without temperature compensation (i.e. without the control signal CON1 input to the OTA 62).

As can be appreciated from FIG. 4, without temperature compensation the control signal CON1 is forced to rise and fall significantly (taking it outside the sweet spot) to cope with the change in ambient temperature, whilst the control signal CON2 remains relatively constant. In contrast, with temperature compensation the control signal CON2 rises and falls significantly to cope with the change in ambient temperature, whilst the control signal CON1 is able to maintain relatively constant and comfortably within the sweet spot.

It will be appreciated that in a synthesiser, or control circuitry, embodying the present invention, it may be desirable to produce different possible output signals OUT, in a controllable fashion. For example, in the case of a synthesiser, it may be desirable to output different output frequencies $F_{OUT}$.

With different output signals OUT, it may be necessary to have corresponding different values of the control signal CON1. Whilst this is of course possible, it is desirable to maintain the same "sweet spot" irrespective of the desired output signal OUT. To provide this capability, the output-signal generator 40 or VCO 58 in embodiments of the present invention is adapted to receive yet a further control signal CON3 (not shown). Control signal CON3 is employed to adapt operation of the output-signal generator 40 or VCO 58 such that the same or a closely-similar "sweet spot" is obtained in each case. This is advantageous, since a closely-maintained "sweet spot" enables corresponding components to be optimised to always operate in that "sweet spot".

Figure 5:
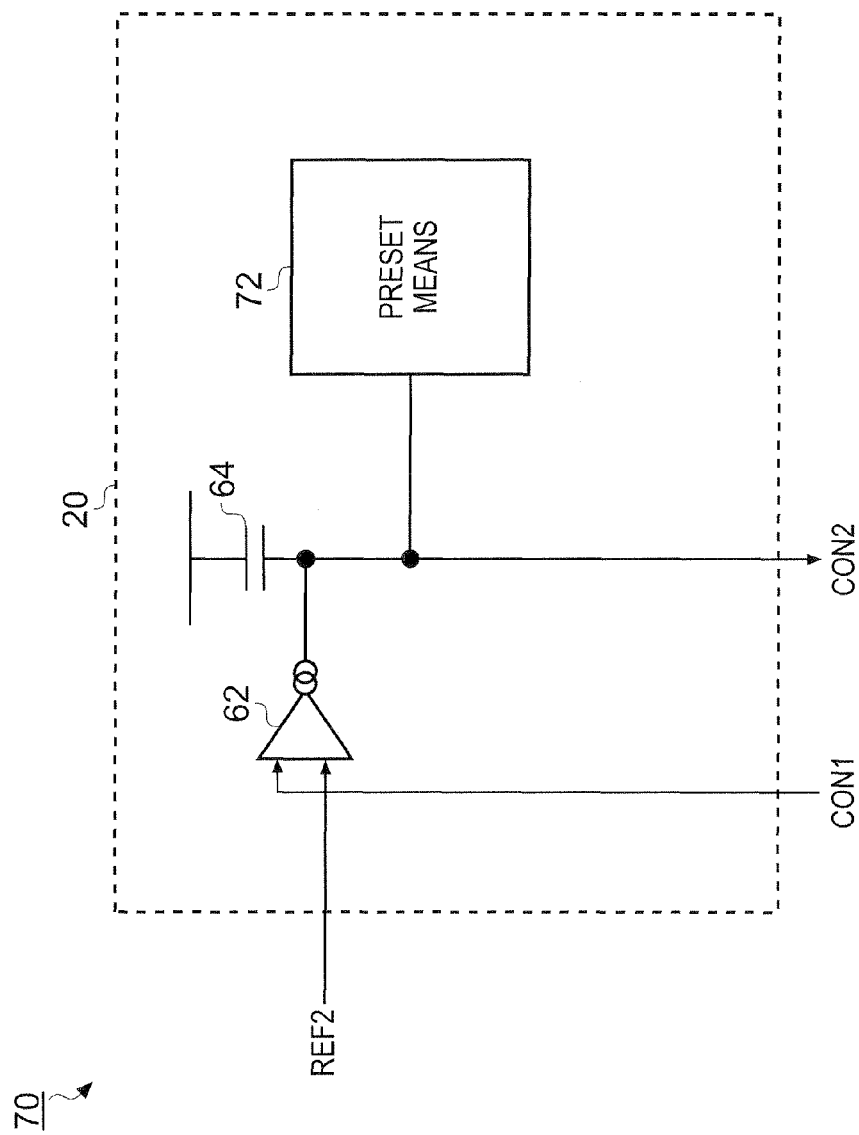
FIG. 5 is a schematic diagram of circuitry 70, which may be considered to be a modified version of second control means 20.

FIG. 5 is a schematic diagram of circuitry 70, which may be considered to be a modified version of second control means 20. The second control means 20 is shown implemented as in control circuitry 50, however it will be appreciated that circuitry 70 is generally applicable in control circuitry 1.

In particular, circuitry 70 comprises preset means 72. Preset means 72 is employed to set control signal CON2 at an initial value on start-up, or during a setup phase. For example, in the case that second control means 20 is employed to compensate for ambient temperature variation, preset means 72 may be employed to preset control signal CON2 at a value corresponding to the current ambient temperature. Circuitry 70 may employ a temperature sensor (not shown) for use in measuring the current ambient temperature for such purposes.

The benefit or preset means 72 can be appreciated by considering capacitor 64. To cope with, for example, a large range in ambient temperature (e.g. −40° C. to +125° C.) it is desirable for the voltage level stored on capacitor 64 to be able to move from a current value, representing the current ambient temperature, to values representing the extreme ends of the temperature range (in cases when the temperature changes accordingly). It is therefore desirable to preset the voltage level stored on capacitor 64 to a value, in the range of voltage values storable on capacitor 64, corresponding to the position of the current ambient temperature in the temperature range. This enables the circuit to operate linearly over the full desired range.

Although not shown in FIG. 5, an on-chip digital temperature sensor can be provided for use with preset means 72. Of course, if another factor were to be the controlling factor, for example ambient pressure, then a pressure sensor may be provided instead. Combinations of sensors could be provided to monitor different controlling factors, and to therefore enable the circuit to compensate for changes in any one or more of those controlling factors.

The following description details an implementation of an embodiment of the present invention, as presented in a paper entitled "Wide-Range Low-Noise Fast-Hopping Fractional-ΣΔ Synthesiser in 1.2-V 90 nm CMOS", by Marton et al, Fujitsu Sci. Tech. J., 44, 3, p274-284(July 2008). This paper is obtainable from http://www.fujitsu.com/downloads/MAG/vol44-3/paper08.pdf, and the entire content thereof is incorporated herein by reference. Particular reference is made to section 2.3 of that paper, however the entire paper is particularly relevant to the present invention.

The VCO in the example implementation consists of four main analog blocks, as shown in FIG. 6. These four blocks are labelled as: VCO core; VCO amplitude control; VCO temperature compensation; and VCO loop filter precharge, and will be considered in turn. Because their complex functionality requires sophisticated digital logic, interfaces were implemented to allow the blocks to be controlled by state machines in a central digital unit.

The noise performance of the VCO is mainly defined by its core circuit (VCO core). Until recently, bipolar devices have been assumed to be superior in terms of flicker noise, but the latest design techniques have been developed to compensate for the up-conversion of flicker noise in pure CMOS technologies. A low-noise design is achieved firstly by using low-noise components and secondly by designing them to avoid frequency conversion to the output target frequency. Therefore, the VCO core consists of PMOS cross-coupled transistors and a low-flicker-noise programmable resistive current source.

The differentially driven LC-tank comprises a center-tapped 3-metal inductor, varactors, and 2×4 bit matrixes of switchable capacitances for digitally-controlled tuning.

Using NMOS-switches to short or open the differentially placed high-Q metal-insulator-metal (MIM) capacitors between both oscillating nodes was found to be the most effective way to balance the digital frequency trimming.

Because the wide tuning range capability gives rise to a corresponding variation of the tank circuit impedance, a fast oscillation startup might be not guaranteed for the worst process conditions and lowest frequency settings. To avoid the risk, the VCO is started at its highest frequency, and an amplitude-level control circuit then calibrates the output signal level.

Regarding VCO amplitude control, an amplitude-level detection circuit was implemented. This circuit and a counter-based state machine (located inside the digital block) form an output voltage magnitude control loop. The level detection consists of a rectifier plus low-pass filter and a hysteresis-comparator, which outputs a logic level corresponding to the comparison result of the VCO output magnitude and a preset (desired) amplitude value. Since it is sampled digitally within several subsequent steps, this output applies negative feedback to the amplitude settings so that after seven iterative steps the amplitude level is guaranteed to settle close to the predefined value.

The proper amplitude-level control settings are calibrated for every (integer) frequency value to track the impedance change of the LC-tank, and they are restored after frequency reprogramming.

Regarding VCO temperature compensation, and in particular relation to embodiments of the present invention, the circuit implemented in the present example includes a second varicap, forming an additional analog tuning input used for temperature compensation. During the calibration phase, the temperature-compensation circuit pre-charges an external capacitor (c.f. capacitor 64, FIG. 3) to a voltage corresponding to the absolute temperature (current ambient temperature) during initialization (a setup phase).

The initial temperature information is derived from an on-chip digital temperature sensing circuit. A reference voltage depending on the temperature information is fed to an external capacitor to pre-charge a reproducible starting value corresponding to the junction temperature.

After the operation of the synthesiser has started, its main control voltage is monitored continuously by a low-output-current operational transconductance amplifier (OTA), which compares the predefined mid-voltage (the "sweet spot", which in the present example is chosen to be 0.55 V, c.f. REF2, FIG. 3) with the actual control voltage (c.f. CON1, FIG. 3).

Figure 7:
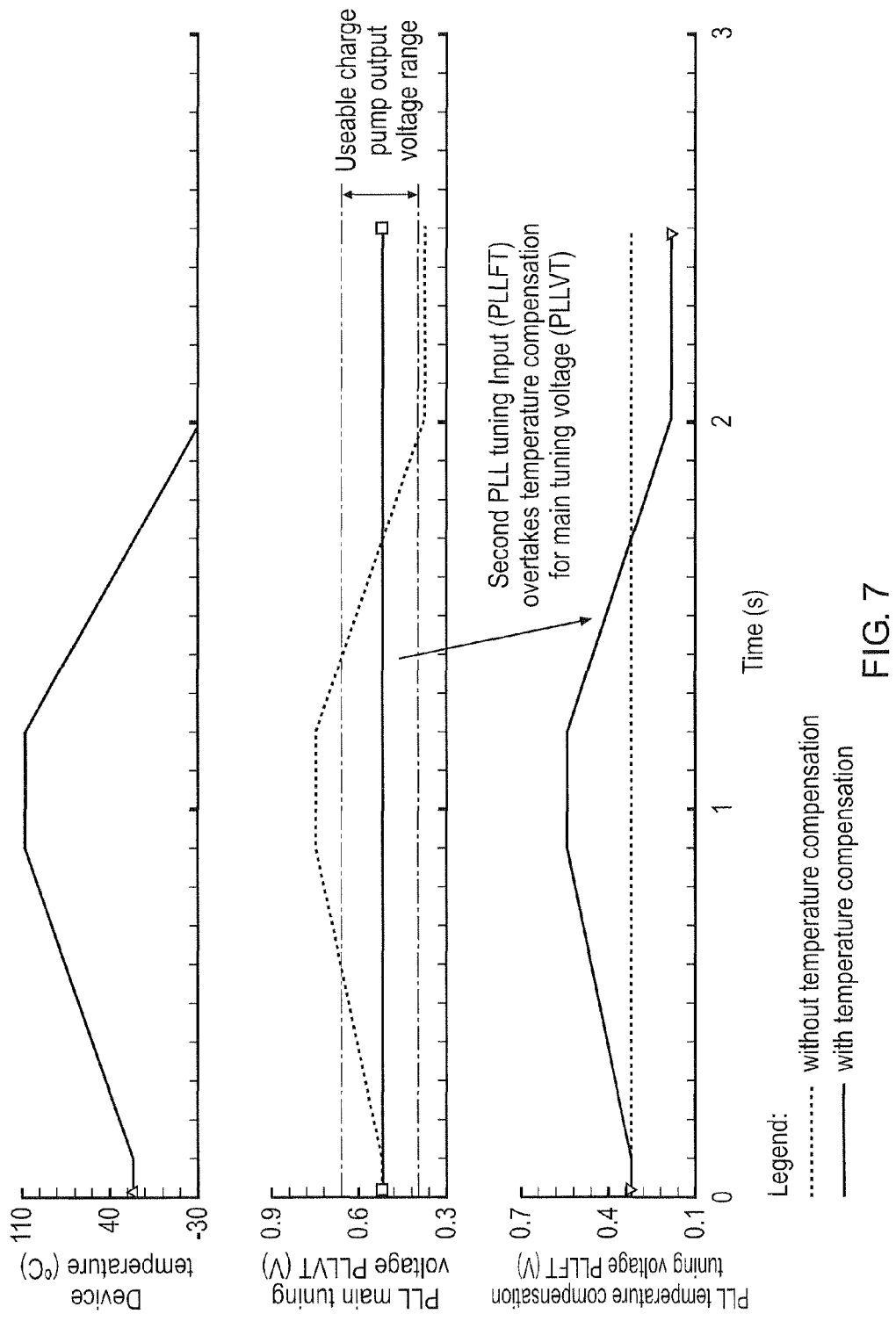
FIG. 7 shows three graphs useful for better understanding operation of the FIG. 6 implementation.

Any changes or disturbances, which cause a drift of this actual control voltage (assumed to be mainly frequency changes due to temperature drift), cause a small corresponding current to flow into the external capacitor (c.f. capacitor 64, FIG. 3). The resulting voltage change on the second VCO input (solid curve in FIG. 7) is completed when the output of the operational transconductance amplifier comes back into balance, which is the case when the main synthesiser control voltage (c.f. CON1, FIG. 3), the dashed curve in FIG. 7, reaches 0.55 V (the "sweet spot").

The additional VCO input used for this function is also a noise contributor. The wider voltage control range increases the risk of excessive noise generation because of the greater steepness of the varicaps at low voltages, which converts low-frequency voltage noise into carrier phase noise.

A suitable compromise was found by using a high capacitance value (100 nF) for the external capacitor, which forms a low impedance even at frequencies below 10 kHz, reducing noise voltage generation via the temperature compensation input. The second analogue control loop (the auxiliary loop) is then formed by the operational transconductance amplifier, the external 100-nF capacitor and the second VCO control input.

Instability due to interaction between the two analog control loops (the main loop and the auxiliary loop) could occur, however the large 100-nF blocking capacitor results in very low bandwidth of the second control loop, which prevents interaction between the two loops.

Since this synthesiser is a sophisticated system with analog and digital frequency control, its behaviour during calibration and recalibration (in the initial state of the hopping phase) is determined by a virtual third digital control loop (this is a feedback loop formed by the digital control function).

To ensure system stability, at least the fast analog loop must be opened during digital recalibration. This is done by forcing a predefined voltage (e.g. 0.55V) onto the loop filter capacitors (VCO loop filter precharge) so that after the forcing circuit has been released the analog control loop will start at the middle of the varicap control range. Of course, the time needed to pre-charge the capacitors becomes part of the hopping time, which reduces the hopping speed. To minimize the impact of this as much as possible, the voltage forcing circuit must be designed with high drivability, but minimal influences such as leakage current and substrate noise coupling while inactive.

To satisfy this requirement, the fourth part of the VCO-block is a combination of a fast comparator and a high-current up/down switchable source intended to precharge the loop filter main capacitor with the example 0.55-V reference voltage for less than 7 us.

Much of the functionality of the present synthesiser example implementation lies in the digitally synthesized block, which allows the implementation of sophisticated high-speed algorithms for fast locking and phase noise improvement.

Figure 8:
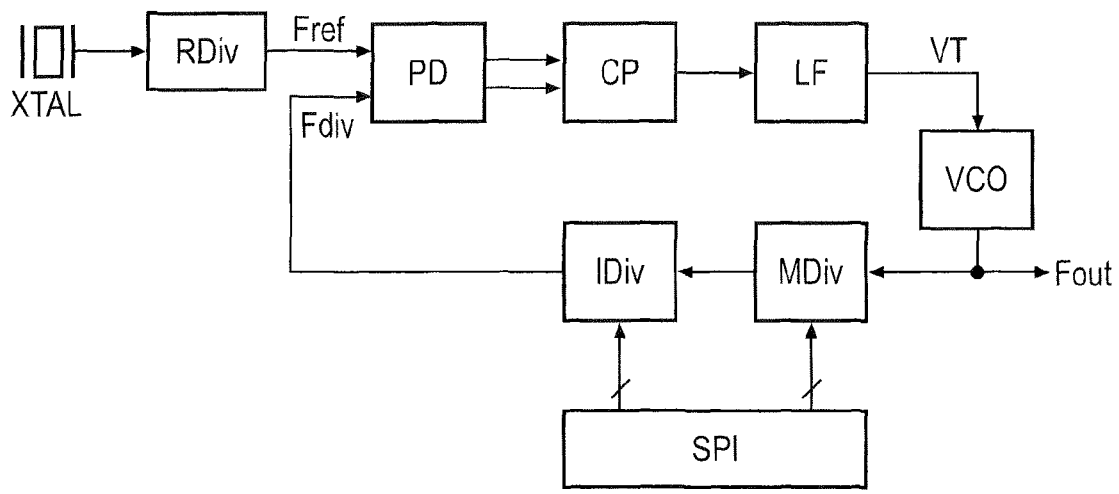
FIG. 8 is a simplified functional block diagram of the FIG. 6 synthesiser architecture.

A simplified functional block diagram of the synthesiser architecture is shown in FIG. 8. One difference from previously-considered ΣΔ (sigma-delta) synthesiser circuits is the divider chain main divider (MDiv) and integer divider (IDiv), which are both controlled by the serial peripheral interface instead of a single multi-modulus divider stage being used. A more detailed view of the synthesiser architecture with emphasis on the analog units is shown in FIG. 9.

The MDiv is a dual modulus divider (prescaler), which can be programmed for three sets of dual modulus division ratios. The selected frequency generation scheme is decoded into one of the above three sets of division ratios and rounded out by the matching division ratio of the IDiv (13, 14, 15, or 16). The control within the selected set (in selecting between n and n+1) is done by a third-order sigma delta pseudo-random generator, where the 7-level output is mapped into the first of seven subsequent n/n+1 cycles, counted by the IDiv.

This architecture has the advantage of using a small subset of fast division ratios (total of 4, i.e. n, n+1, n+2, n+3), while matching the higher dynamic range of the third-order sigma delta (7 levels) and achieving, together with the programmable IDiv, a continuous range of total division ratios from 5 to 154. This is required to cope with the desired frequency range from 2.766 to 3.253 GHz including an example choice of reference frequencies between 22.4 and 26.0 MHz. Six or more additional cycles (to the seven cycles controlled by the third-order sigma delta pseudo-random generator) were found to be suitable for obtaining a continuous divider ratio range. This results in a total minimum IDiv ratio of 13, which is affects the flexibility of the present example implementation.

The digital control unit also includes the state machines for the described control functions (e.g., VCO amplitude control, loop filter precharge, and frequency calibration and recalibration).

As described above, as a result of a digitally-controlled VCO concept employed in the present example implementation, successful frequency locking (digital frequency calibration and recalibration) becomes possible with calibration setting of its capacitor matrix. During the sequential calibration flow, the calibration state machine automatically targets 24 fixed integer calibration frequencies for a reference setting of 22.4 MHz or 21 integer frequencies for a 26-MHz reference setting (both covering the specified frequency range). Reference frequencies such as 52 or 44.8 MHz are divided by two to match the PLL reference frequencies of 26 or 22.4 MHz.

Fast and precise frequency acquisition may be accomplished by controlling (counting) the pulses on the input of the IDiv, which enables the maximum possible speed (or precision) of the measurement. In the present implementation, this is around 13 times faster than the used reference frequency. The required capacitor matrix settings are estimated, in the present example, in a successive approximation algorithm starting from the highest frequency. The algorithm estimates the most significant bit (MSB) setting first and all matrix bits are subsequently set/reset until the synthesiser frequency becomes within ½ of the least significant bit (LSB) of the calibration target (actual LSB frequency resolution varies over the frequency range because of the nonlinear dependence between the capacitance and frequency).

FIG. 10 shows an example frequency calibration sequence (VCO output frequency over time) relating to the example implementation. The modification of the digital control value in the capacitor matrix (as a frequency value over time) is shown in FIG. 10 for a typical (simulated) successive approximation calibration flow for the frequency of 3.1808 GHz.

The example calibration sequence ends with the setting of a pre-programmed frequency 2.912 GHz, which is needed for further calibration of the front-end.

After the programming of a fractional divider value during frequency hopping, the calibration data might differ by more than 50% of the reference frequency from the final target, mainly because of the fractional value. To avoid locking problems, the initial phase of the lock-up procedure repeats the last four steps of the calibration flow, re-adjusting the capacitor matrix. To ensure the maximum possible frequency acquisition precision (or minimum jitter) when a fractional divider ratio is used, the ΣΔ generator is forced to the first order during this phase. A further speed increase is achieved by skipping subsequent comparisons after eventually achieving the target locking precision (50% LSB) after any intermediate stage as shown in FIG. 11 (frequency value over time). With all the described techniques, this phase takes less than 20 μs to set the VCO frequency over the capacitor matrix to within 5 MHz of the target frequency.

FIG. 11 shows an example of output frequency during recalibration (shortened sequence) and final analogue locking, relating to the example implementation. During the frequency acquisition phase (first part of the sequence in FIG. 11), the ΣΔ generator is also forced to the first order to enable precise digital frequency comparison (Frequency/phase acquisition control). The increased spurious generation with the first-order ΣΔ is not relevant during frequency hopping because the carrier is not used at this time. Furthermore, the digital control unit forces the edge of the output divider pulses to a position very close to the target reference clock phase (see also ref. clock edges in FIG. 12), avoiding a phase jump and resulting potential cycle slip and reducing or preventing any corresponding increase in the lock-up time.

In the present implementation, benefits also arise from the employed phase detector concept. The exclusive-OR (ExOr) phase detector principle, chosen for its linearity (inherently superior to phase frequency detectors) also has a disadvantage: The resulting output pulse duration, which is about 50% of the period for every pulse, causes potential 100% noise transfer for both output pulses from the current sources of the charge pump to the VCO. Further disadvantages are (i) the resulting high reference leakage power (the spectral power in the VCO output, placed at ±the reference frequency from the carrier), which increases the required loop filter order and (ii) the need for a precise 50% duty cycle reference.

A solution to the above problems has been devised. Using some of the additional six IDiv-cycles to define a precisely fixed length time-slot (a fixed position fraction of the reference clock cycle) for the charge pump output allows noise and reference leakage power reduction at least as efficiently as can be done with a phase frequency detector, while still keeping the superior linearity of the ExOr phase detector.

Three different possibilities (time slots) for masking the ExOr phase detector input are shown in FIG. 12. Fixed lengths of 6, 4, or 2 IDiv pulses within a 13 pulse-cycle (first 7 cycles are controlled by the $\Sigma\Delta$ output which is a random integer between 0 and 7) are considered, so they reduce the effective output duty-cycle to 23%, 16%, or 7.7%, respectively. In the example implementation described here, the second possibility was chosen with four pulses and a total output pulse duty cycle of 16%. The inherent static noise and reference leakage reduction, over previously-considered phase detector architectures, is expected to be 3.25 times, or 10.2 dB. It is envisaged that a further improvement up to 6.5 times (16.2 dB) should be possible if a very precise and fast charge pump is developed in the future.

Because of the high complexity of the digital control unit (FIG. 13) and synthesis difficulties resulting from the use of two asynchronous clock domains in the present implementation, care was taken (in the digital unit implementation) to prevent noise coupling. Split supply domains were used to avoid an increase in jitter in the most critical clock paths (dark grey domain). The digital layout was also placed in a triple well region to isolate potential substrate noise from the sensitive area. Due to the high complexity, good testability was considered important and test features were implemented in the synthesiser macro. Several internal signals may be routed to outputs and external signals can be forced to specific internal nodes.

The charge pump circuit is often a critical noise contributor in a frequency synthesizer. The challenge of improving it comes from the two conflicting mechanisms of in-band noise generation: 1) by direct noise generation of the output current sources, where a larger device size is the way to lower noise; and 2) non-linearity due to switching speed limitations, resulting in nonlinear $\Sigma\Delta$-value-to-charge dependence. This nonlinear dependence folds the wideband sigma delta noise close to the carrier, increasing the in-band phase noise. A smaller device size enables a higher switching speed and results in less noise folding in that case, which conflicts with the first dependency.

While the amount of noise generated in the output current sources can be predicted quite well by simulation (though with considerable effort), a precise estimation of the folding of $\Sigma\Delta$-noise over the charge pump (and phase detector) non-linearity to synthesizer noise is complex and difficult to simulate. One possible approach with existing development tools is to thoroughly evaluate the first silicon (a first implementation) and then improve the balance in a subsequent design phase (a subsequent implementation). A good performance balance is achieved when the difference between the integer and fractional performances approaches 3 dB.

The desire for 1.2-V supply voltage operation (compared with 3-V for previously-considered synthesizers) further increases the design difficulty because of the unfavourable ratio between the control value (2.4 times lower for a 1.2-V supply compared with a 3-V one) and input noise voltage of the biasing circuit (unchanged). Careful circuit improvement in this area and many iterative simulations have lead to reducing the impact of noise from the output current sources.

The use of 1.2-V devices and a modification of the output current switching PMOS current sources (from common source cascade type to transmission gate with a dummy load) was helpful in enabling output duty-cycle reduction (discussed above).

Measurement results at 3.01 GHz, show that silicon PN-performance was close to what was expected; the in-band noise level was −94.8 dBc/sqrHz. A low PN level is useful for allowing the setting of sufficient synthesizer bandwidth to achieve a fast lock-up time. The bandwidth set for the measurements was about 200 kHz and this resulted in (integrated) RMS noise of 0.92° rms.

The lock-up time was measured shown with 200-kHz bandwidth and 0.92° RMS PN. The output frequency error from the target (3.01 GHz) was plotted against time after a new frequency was programmed. The specified final precision of <130 Hz was achieved after 130.8 µs.

A concept of a wide-frequency-range synthesizer capable of very low phase noise and fast hopping, and suitable for integration in deep-submicrometer CMOS technology, has been disclosed herein. The desired analogue performance (typical for this kind of technology) have been met by choosing optimized circuit topologies and using sophisticated digital control algorithms. The required performance, which is not practically feasible with a completely analogue design approach, has been achieved by increasing the design complexity and using autonomous built-in state machines for continuous tracking and optimization of the analogue operating points. This approach was also useful for compensating for a significant process variation range, which is a consequence of the reduced structure size in state-of-the-art technologies. Measurement results showed phase noise of −94.8 dBc/sqrHz and a lock-up time of 130.9 µs, which are very close to the expected values. Three main techniques were successfully implemented within the synthesizer design, allowing a simplified prescaler and extremely good phase detector linearity. The phase detector concept used in this development has potential for future phase noise improvement.

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

Embodiments of the present invention may be defined by the following statements:

1. Control circuitry, comprising:
   first control means operable to generate a first control signal, the first control signal being indicative of a relationship between an output signal and a first reference signal, and to generate said output signal in dependence upon said first control signal, the first control means being configured to tend to maintain a first desired relationship between the output signal and the first reference signal in response to said first control signal; and
   second control means configured to influence operation of said first control means in response to said first control signal by way of a second control signal so as to tend to maintain a second desired relationship between said first control signal and a second reference signal.

2. Control circuitry according to statement 1, wherein said second control means is operable to generate said second control signal, the second control signal being indicative of a relationship between the first control signal and the second reference signal.

3. Control circuitry according to statements 1 or 2, wherein:
   said circuitry is susceptible to high-frequency disturbances and to low-frequency disturbances;
   said high-frequency disturbances are low-energy disturbances only capable, in the absence of said low-frequency disturbances, of causing a magnitude of said first control signal to fluctuate by a particular amount; and
   said low-frequency disturbances are high-energy disturbances capable, in the absence of said second control means, of causing the magnitude of said first control signal to fluctuate by an amount substantially larger than said particular amount.

4. Control circuitry according to statement 3, wherein said second control means is operable to control said first control means with said second control signal such that the magnitude of said first control signal in the presence of such high-frequency and low-frequency disturbances fluctuates (only) within a band of magnitude values defined by said particular amount.

5. Control circuitry according to statement 4, wherein said second control means comprises band-positioning means operable to controllably position said band of magnitudes relative to a datum magnitude.

6. Control circuitry according to statement 4 or 5, comprising means operable to control operation of said first control means such that, when said first desired relationship is changed, a position of said band of magnitudes relative to the or a datum magnitude remains the same.

7. Control circuitry according to any statements of 3 to 6, wherein:
   said first control means forms a first control loop configured to compensate for the effect of said high-frequency disturbances in said first desired relationship; and
   said second control means forms part of a second control loop configured to compensate for the effect of said low-frequency disturbances in said first desired relationship by way of compensating for corresponding low-frequency disturbances in said second desired relationship.

8. Control circuitry according to any of statements 3 to 7, wherein the low-frequency disturbances result from changes in ambient temperature.

9. Control circuitry according to any of the preceding statements, wherein the second control means is responsive to substantially lower-frequency changes in said control signal than that of said first control means.

10. Control circuitry according to any of the preceding statements, wherein:
    said first control means has a first low-pass filter operative upon said first control signal;
    said second control means has a second low-pass filter operative upon said second control signal; and
    the cut-off frequency of said second low-pass filter is substantially lower than that of said first low-pass filter.

11. Control circuitry according to any of the preceding statements, configured to perform the function of a phase-lock loop, wherein:
    said first control means comprises a dual-input voltage-controlled oscillator; and
    one of those inputs is connected to receive said first control signal and the other one of those inputs is connected to receive said second control signal.

12. Control circuitry according to any of the preceding statements, wherein said second control means is operable to generate said second control signal in dependence upon a comparison between the first control signal and the second reference signal.

13. Control circuitry according to statement 12, wherein said second control means comprises a comparator configured to carry out said comparison.

14. Control circuitry according to statements 12 or 13, wherein said second control means comprises an amplifier operable in dependence upon said comparison to generate said second control signal such that said second control signal may fluctuate over a substantially large range relative to fluctuations of said first control signal.

15. Control circuitry according to any of statements of 12 to 14, wherein said second control means comprises an operational transconductance amplifier configured to carry out said comparison.

16. Control circuitry according to any of statements 12 to 15, wherein means in said second control means operable to carry out said comparison serves to DC-separate said second control signal from said first control signal.

17. Control circuitry as stated in any of the preceding statements, wherein:
    said first reference signal has a reference frequency;
    said output signal has an output frequency; and
    said first desired relationship is a frequency-based relationship between
    said reference frequency and said output frequency.

18. Control circuitry as claimed in any of the preceding statements, wherein:
    said second reference signal has a reference magnitude;
    said first control signal has a control magnitude; and
    said second desired relationship is a magnitude-based relationship between said reference magnitude and said control magnitude.

19. Control circuitry according to any of the preceding statements, wherein at least one of said first and second desired relationships is controllable.

20. Control circuitry according to any of the preceding statements, wherein said second control means comprises preset means operable, during a setup phase, to preset said second control signal to a preset value, and wherein said second control means is operable, during an operational phase, to base generation of the second control signal on said preset value.

21. Control circuitry according to statement 20, wherein said preset value is configurable in dependence upon an external factor.

22. Control circuitry according to statement 21, wherein said external factor is current ambient temperature, and wherein said preset means comprises a sensor operable to measure the current ambient temperature.

23. Control circuitry according to statement 21 or 22, wherein said preset value is a value in a range of magnitude values open to said second control signal corresponding to the position of the current ambient temperature within a range of ambient temperatures over which the circuitry is adapted to operate.

24. Control circuitry according to any of the preceding statements, wherein the second reference signal is different from the first reference signal.

25. Phase-lock loop circuitry, comprising control circuitry according to any of the preceding statements.

26. A synthesiser, comprising control circuitry according to any of statements 1 to 24.

27. A transmitter, a receiver or a transceiver for use in a wireless communication system, comprising control circuitry according to any statements of 1 to 24.

28. A wireless communication system, comprising at least one transmitter and at least one receiver according to statement 27.

29. A control method, comprising:
generating a first control signal, the first control signal being indicative of a relationship between an output signal and a first reference signal;
generating said output signal in dependence upon said first control signal;
acting to maintain a first desired relationship between the output signal and the first reference signal in response to the first control signal; and
influencing generation of said first control signal in response to said first control signal by way of a second control signal so as to tend maintain a second desired relationship between said first control signal and a second reference signal.

The invention claimed is:

1. Control circuitry, comprising:
first control means operable to generate a first control signal, the first control signal being indicative of a relationship between an output signal and a first reference signal, and to generate said output signal in dependence upon said first control signal, the first control means being configured to tend to maintain a first desired relationship between the output signal and the first reference signal in response to said first control signal, wherein said first control means forms a first control loop configured to compensate for the effect of hiqh-frequency disturbances in said first desired relationship; and
second control means configured to influence operation of said first control means in response to said first control signal by way of a second control signal so as to tend to maintain a second desired relationship between said first control signal and a second reference signal, wherein said second control means forms part of a second control loop configured to compensate for the effect of low-frequency disturbances in said first desired relationship by way of compensating for corresponding low-frequency disturbances in said second desired relationship.

2. Control circuitry as claimed in claim 1, wherein:
said high-frequency disturbances are low-energy disturbances only capable, in the absence of said low-frequency disturbances, of causing a magnitude of said first control signal to fluctuate by a particular amount; and
said low-frequency disturbances are high-energy disturbances capable, in the absence of said second control means, of causing the magnitude of said first control signal to fluctuate by an amount substantially larger than said particular amount.

3. Control circuitry as claimed in claim 2, wherein said second control means is operable to control said first control means with said second control signal such that the magnitude of said first control signal in the presence of such high-frequency and low-frequency disturbances fluctuates within a band of magnitude values defined by said particular amount.

4. Control circuitry as claimed in claim 3, wherein said second control means comprises band-positioning means operable to controllably position said band of magnitudes relative to a datum magnitude.

5. Control circuitry as claimed in claim 4, comprising means operable to control operation of said first control means such that, when said first desired relationship is changed, a position of said band of magnitudes relative to the Of a datum magnitude remains the same.

6. Control circuitry as claimed in claim 2, wherein the low-frequency disturbances result from changes in ambient temperature.

7. Control circuitry as claimed in claim 1, configured to perform the function of a phase-lock loop, wherein:
said first control means comprises a dual-input voltage-controlled oscillator; and
one of those inputs is connected to receive said first control signal and the other one of those inputs is connected to receive said second control signal.

8. Control circuitry as claimed in claim 1, wherein said second control means is operable to generate said second control signal in dependence upon a comparison between the first control signal and the second reference signal.

9. Control circuitry as claimed in claim 8, wherein said second control means comprises a comparator configured to carry out said comparison.

10. Control circuitry as claimed in claim 8, wherein said second control means comprises an amplifier operable in dependence upon said comparison to generate said second control signal such that said second control signal may fluctuate over a substantially large range relative to fluctuations of said first control signal.

11. Control circuitry as claimed in claim 8, wherein means in said second control means operable to carry out said comparison serves to DC-separate said second control signal from said first control signal.

12. Control circuitry as claimed in claim 1, wherein said second control means comprises preset means operable, during a setup phase, to preset said second control signal to a preset value, and wherein said second control means is operable, during an operational phase, to base generation of the second control signal on said preset value.

13. Control circuitry as claimed in claim 12, wherein said preset value is configurable in dependence upon an external factor.

14. Control circuitry as claimed in claim 13, wherein said preset value is a value in a range of magnitude values open to said second control signal corresponding to the position of the current ambient temperature within a range of ambient temperatures over which the circuitry is adapted to operate.

* * * * *